(12) United States Patent
Maherault et al.

(10) Patent No.: US 9,863,655 B2
(45) Date of Patent: Jan. 9, 2018

(54) DEVICE FOR STORING ARTICLES IN CONTROLLED ATMOSPHERE

(75) Inventors: Vincent Maherault, Houston, TX (US); Robert Briend, Houston, TX (US); Marc Leturmy, Houston, TX (US)

(73) Assignee: L'Air Liquide, Société Anonyme l'Etude et l'Exploitation des Procédés Georges Claude, Paris (FR)

( * ) Notice: Subject to any disclaimer, the term of this patent is extended or adjusted under 35 U.S.C. 154(b) by 727 days.

(21) Appl. No.: 13/811,677

(22) PCT Filed: Jul. 18, 2011

(86) PCT No.: PCT/EP2011/062242
§ 371 (c)(1),
(2), (4) Date: Jan. 23, 2013

(87) PCT Pub. No.: WO2012/013528
PCT Pub. Date: Feb. 2, 2012

(65) Prior Publication Data
US 2013/0122799 A1 May 16, 2013

(30) Foreign Application Priority Data
Jul. 27, 2010 (FR) .................................. 10 56140

(51) Int. Cl.
*F24F 7/00* (2006.01)
*H01L 21/67* (2006.01)
(Continued)

(52) U.S. Cl.
CPC .......... *F24F 7/00* (2013.01); *H01L 21/67017* (2013.01); *H01L 21/67393* (2013.01); *H01L 21/67769* (2013.01)

(58) Field of Classification Search
CPC ................. F24F 7/00; H01L 21/67017; H01L 21/67393; H01L 21/67769
(Continued)

(56) References Cited

U.S. PATENT DOCUMENTS 5,398,159 A 3/1995 Andersson et al.
7,077,173 B2 * 7/2006 Tokunaga ......... H01L 21/67017
141/66
(Continued)

FOREIGN PATENT DOCUMENTS

EP 1102713 5/2001
EP 1333469 8/2003
(Continued)

OTHER PUBLICATIONS

PCT/EP2011/062242, International Search Report, Aug. 18, 2011 (6 pages).

*Primary Examiner* — Gregory Huson
*Assistant Examiner* — Martha Becton
(74) *Attorney, Agent, or Firm* — Elwood L. Haynes

(57) ABSTRACT

The invention relates to a device for storing articles in a controlled atmosphere, comprising: at least one storage module capable of receiving the articles to be stored; a storage module provided with at least one shelf for positioning the articles, the storage module having a substantially parallelepiped shape, and having two substantially vertical and opposite walls between which the shelves extend, wherein the device is characterized in that shutters are provided, each shutter being positioned opposite one of the shelves, and between one of the two walls and the shelf in question, so as to prevent the gas from flowing vertically at the location of a shutter, and to allow the gas to flow only transversely along the shelf associated with the shutter in question.

10 Claims, 6 Drawing Sheets

(51) Int. Cl.
  *H01L 21/673*    (2006.01)
  *H01L 21/677*    (2006.01)

(58) Field of Classification Search
  USPC .............................................. 141/98; 454/254
  See application file for complete search history.

(56) References Cited

U.S. PATENT DOCUMENTS

| | | | |
|---|---|---|---|
| 7,455,734 B2 | 11/2008 | Yamaguchi et al. | |
| 7,694,700 B2 * | 4/2010 | Bernard | H01L 21/67393 141/65 |
| 2002/0124906 A1 * | 9/2002 | Suzuki | H01L 21/67017 141/98 |
| 2010/0025277 A1 * | 2/2010 | Iwaki | H01L 21/67005 206/455 |
| 2010/0141105 A1 * | 6/2010 | Slessman | F28F 9/0265 312/236 |
| 2010/0175781 A1 * | 7/2010 | Kisakibaru | H01L 21/67017 141/98 |

FOREIGN PATENT DOCUMENTS

| | | | |
|---|---|---|---|
| FR | 2747112 | 10/1997 | |
| FR | 2782068 A1 * | 2/2000 | ........... A23L 3/3418 |
| FR | 2803647 | 7/2001 | |
| FR | 2877641 | 5/2006 | |
| JP | S52 136359 | 11/1977 | |
| JP | S61 202028 | 9/1986 | |
| JP | S62 299641 | 12/1987 | |
| JP | H02 120640 U | 9/1990 | |
| JP | H06 51794 U | 7/1994 | |
| JP | 3031234 U | 9/1996 | |
| JP | 2000 121116 | 4/2000 | |
| JP | H07 506222 | 4/2001 | |
| JP | WO 0247152 A1 * | 6/2002 | ....... H01L 21/67017 |
| JP | 2002 522315 | 7/2002 | |
| JP | 2005 021343 | 1/2005 | |
| JP | 2010 238805 | 10/2010 | |
| WO | WO 9522728 | 8/1995 | |
| WO | WO 0007906 | 2/2000 | |
| WO | WO 0247152 A1 * | 6/2002 | |
| WO | WO 2005053016 | 6/2005 | |
| WO | WO 2008062537 | 5/2008 | |

* cited by examiner

DEVICE FOR STORING ARTICLES IN CONTROLLED ATMOSPHERE

CROSS-REFERENCE TO RELATED APPLICATIONS

This application is a §371 of International PCT Application PCT/EP2011/062242 filed Jul. 18, 2011, which claims §119(a) foreign priority to French patent application 1056140, filed Jul. 27, 2010.

FIELD OF THE INVENTION

The present invention relates to the field of devices for storing articles in a controlled atmosphere.

BACKGROUND

Indeed it is known that in many branches of industry (such as the electronics industry, or even the foodstuffs or alternatively the pharmaceutical industry), objects need to be stored more or less temporarily in a controlled atmosphere (for example dry air or alternatively an atmosphere of nitrogen containing only a given limited content of residual oxygen or of residual water vapor) while they are awaiting use or in the process of being manufactured. Thus, taking the electronics industry as an example, means are commonly found for storing, under nitrogen or alternatively under dry air, electronics components that are in the process of being manufactured, for example for storing printed circuits before they are assembled or alternatively for storing bare chips before these are assembled on electronic boards.

Also to be found within this industry are means for storing under dry air or under nitrogen electronic components that can be qualified as obsolete or of strategic importance, that the user cannot be certain of being able to procure in the years to come and of which he quite simply creates his own long-term stock.

It will be appreciated that such storage operations are necessary in order to avoid any interaction between the component and the ambient air, the key risks being associated with the components absorbing moisture from the ambient air, oxidation of the metallic parts of the components or of printed circuit tracks for example, absorption of moisture by plastic encapsulation cases or alternatively reaction with certain contaminating particles in the ambient air (halogenated compounds, etc.).

Further, it is known that one of the technical problems presented by such storage spaces is that these devices are used for short durations, the components being introduced into or removed from the storage member as and when the user site requires them, which means that the storage modules are therefore opened and closed extremely often, sometimes several times per hour.

Although numerous devices of this type are currently available on the market, and even though there is an abundancy of literature relating to these devices (a study may notably be made of documents FR-2 877 641, EP-1 333 469, FR-2 803 647 or alternatively EP-1 102 713), the applicant company has set itself the task of proposing, through the present invention, a novel device that offers the following advantages and improvements:

- of simplifying existing systems in order to reduce the costs thereof;
- of allowing modularity (use of a single storage module or of several modules can be superposed, while at the same time offering the user the ability to use it as mobile equipment (for transporting the articles from a point A to a point B):
- of improving performance in relation to the existing systems;
- of maintaining an irreproachable level of safety under these conditions of simplicity and low cost.

SUMMARY OF THE INVENTION

As will be seen in greater detail in what follows, the present invention notable proposes, in one of its aspects, a novel structure of storage modules that create optimal and controlled circulation of the gas within the storage facility, notably avoiding circulation dead zones, and achieving this through the presence of a system of "shutters", each shutter being positioned facing one of the shelves, between one of the walls of the module and the shelf in question, so as to prevent the gas from passing vertically at the location of a shutter and so as to allow the gas to pass only transversally along the shelf associated with the shutter in question.

The present invention therefore relates to a device for storing articles in a controlled atmosphere, comprising:
- at least one storage module able to accommodate the articles that are to be stored; the storage module being equipped with at least one shelf (preferably at least two shelves) on which to position the articles;
- means for conveying gas into said module; and
- means for discharging the gas from the module,
- at least one of said storage modules being of substantially parallelepipedal shape and having two substantially vertical and opposite walls between which the shelves extend, and
- the means for conveying gas allowing the gas to be injected into the bottom part of the module or into the top part of the module, through one of the two said walls;

and characterized by the implementation of the following measures:
- the means for discharging the gas are situated:
  - i) on the same vertical wall as the means for conveying gas,
  - j) or alternatively on the other vertical wall facing it at the opposite end of the module through the fact that if the gas conveying means are situated at the bottom part of the module then the discharge means are situated at the top part of the module, whereas if the gas conveying means are situated at the top part of the module then the discharge means are situated at the bottom part of the module;
- the module comprises shutters, each shutter being positioned, facing one of the shelves, between one of the two walls and the shelf in question, so as to prevent gas from passing vertically at the location of a shutter and so as to allow the gas to pass only transversally along the shelf associated with the shutter in question;

and characterized in that:
- if the storage module comprises just one shelf, then the storage module comprises just one shutter, situated facing the shelf, between the wall through which the gas arrives and the shelf,
- if the number of shelves, greater than one, and if the means for discharging the gas are situated on the same wall as the means for conveying gas, and if the number of shelves in the module is an even number, then the last shelf of the module seen by the circulation of the gas between the conveying of the gas and the discharge of the gas from the module has no shutter.

According to some advantageous embodiments of the invention, this invention may adopt one or more of the following technical features:

the shutter associated with a shelf is a mechanical component separate from the shelf in question itself, but secured to the shelf in question and extending all along the shelf in question;

the shutter associated with a shelf is part of the shelf in question itself, by construction;

the device comprises at least one technical module, contiguous with and secured to said storage module at one of the vertical walls thereof, in fluidic communication with this storage module said means for conveying gas allowing the gas to arrive in the technical module and thence be injected into the bottom part of the module or into the top part of the module, through the wall in common, whereas said means for discharging the gas are situated on the same wall as the means for conveying gas and allow the gas to be discharged from the storage module to the technical module and thence to the outside;

the device comprises at least one technical module, contiguous with and secured to said storage module at one of the vertical walls thereof, in fluidic communication with this storage module said means for conveying gas allowing the gas to arrive in the technical module and thence be injected into the bottom part of the module or into the top part of the module, through the wall in common of the technical module, and the device also comprises at least one gas collection and discharge module, likewise contiguous with and secured to said storage module at the same vertical wall in common of the technical module, said means of discharging the gas allowing the gases to be discharged from the storage module to the collection module and thence to the outside;

the gas collection and discharge module is fitted with at least one non-return valve preventing gases discharged from the storage module from passing from the collection module to the technical module;

the storage device comprises several storage modules that are superposed in order to obtain the desired overall storage volume for the articles, and associated with each storage module is a technical module, contiguous with and secured to the storage module in question at one of the vertical walls thereof, in fluidic communication with this storage module, means for conveying gas allowing the gas to arrive in each technical module and thence be injected into the bottom part of the associated module or into the top part of the associated module, through the wall they have in common, means for discharging the gas being situated on the same wall as the means for conveying gas and allowing the gas to be discharged from the storage module to the technical module and thence to the outside;

the storage device comprises several storage modules that are superposed in order to obtain the desired overall storage volume for the articles, and associated with each storage module is a technical module, contiguous with and secured to the storage module in question at one of the vertical walls thereof, in fluidic communication with this storage module, means for conveying gas allowing the gas to arrive in each technical module and thence be injected into the bottom part of the associated module or into the top part of the associated module, through the wall they have in common, and, associated with each storage module is a gas collection and discharge module, likewise contiguous with and secured to the storage module at the same vertical wall in common of the technical module, said means of discharging the gas allowing the gases to be discharged from the storage module to the collection module associated with it and thence to the outside;

the collection modules of the device form a single hollow vertical column to which all of the gases discharged from each storage module of the device are returned.

According to one preferred embodiment of the invention, the means for controlling the arrival and extraction of gases comprise no electrical element; they are all of pneumatic type (notably with the notable absence of any electrically operated valve).

BRIEF DESCRIPTION OF THE FIGURES

Further features and advantages of the present invention will become more clearly apparent in the following description, given by way of entirely nonlimiting illustration given with reference to the attached drawings in which.

DETAILED DESCRIPTION OF THE INVENTION

Figure 1:
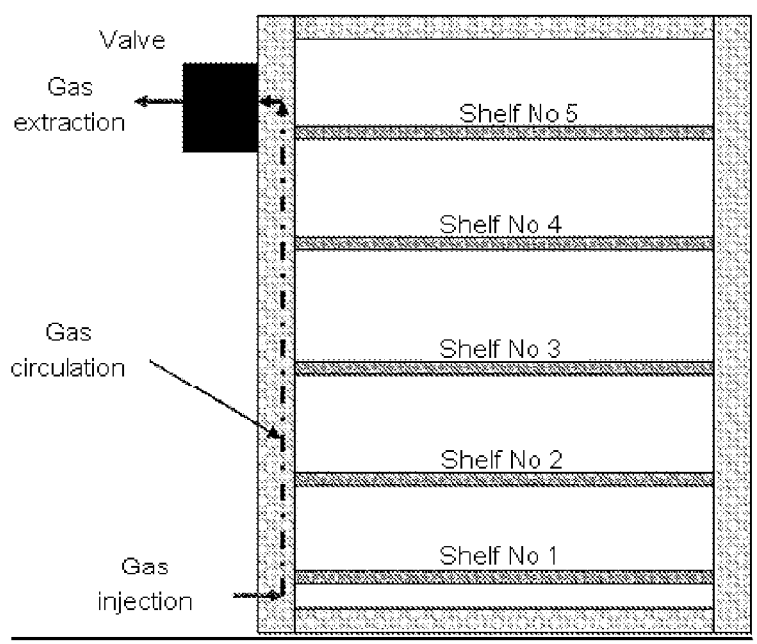
FIG. 1 is a face-on partial schematic view of a shelved storage module of the prior art, creating a preferred path for the gas between one of the walls of space and the shelves, along this wall.

FIG. 1 provides a perfect illustration of the disadvantages presented by certain devices of the prior art, where nitrogen arrives and gases are discharged both on the same wall of the storage module, the preferred path for the gas being between the wall in question and the shelves, even though of course some of the gas also circulates in the module and between the shelves, but it will then be appreciated that some zones of the module will undeniably be very poorly covered (swept).

Figure 2:
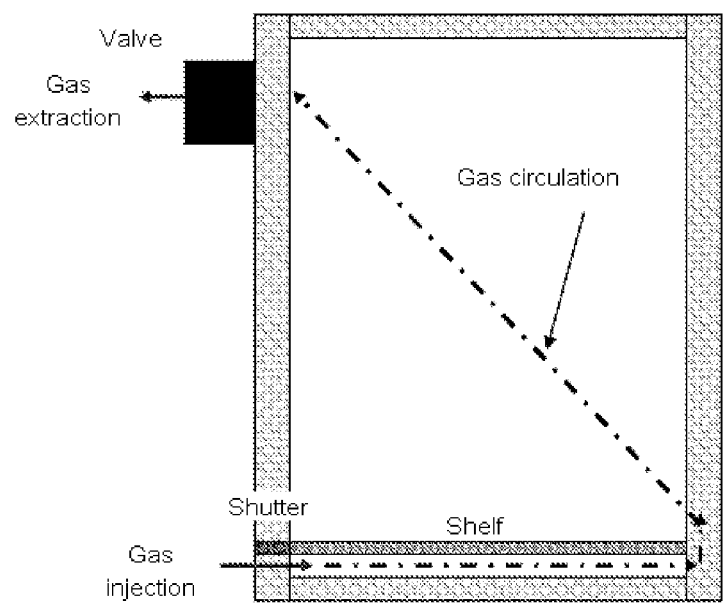
FIG. 2 is a face-on partial schematic view of a device according to the invention, using an odd number of shelves (in this instance just one single shelf)

FIG. 2 on the other hand provides a good illustration of the improvement afforded by the present invention, through a device (viewed in part) according to the invention, using a module with a single shelf, the shelf being equipped (by initial construction or through an attached component) with a shutter on its left-hand part, i.e. between the gas inlet wall and the shelf.

In this embodiment, the means for discharging the gas are situated on the same vertical wall as the means for conveying gas, the conveying means being situated in the bottom of the module while the gas is discharged at the top part. In such a case of a single shelf, it would actually be preferable according to the invention for the gas inlet and gas discharge to be positioned on the same wall of the module, as illustrated here.

Further it is then perfectly easy to see how, using this single shutter, the gas is prevented from passing vertically at the location of the shutter, and therefore along the gas inlet wall, and the gas is allowed to pass only transversally along the shelf associated with the shutter in question, the gas then reaches the opposite end of the shelf where it can pass along the other face of the shelf, such that the gas can therefore progress along each face of the shelf in order to prevent there being any dead zone that is not swept.

As will be clearly evident to a person skilled in the art, while the view depicted here does not demonstrate the depth of the device, it will be appreciated that, for preference, for all devices according to the invention, the shelves butt against the rear wall of the storage module (the back wall) and protrude as far forward as possible in the module while at the same time allowing the front door to be closed, the purpose of this being to minimize "losses" of gas at the front or back of the module, as this would cause a corresponding reduction in the circulation along the preferred path created by the invention by the set of shutters.

Figure 3:
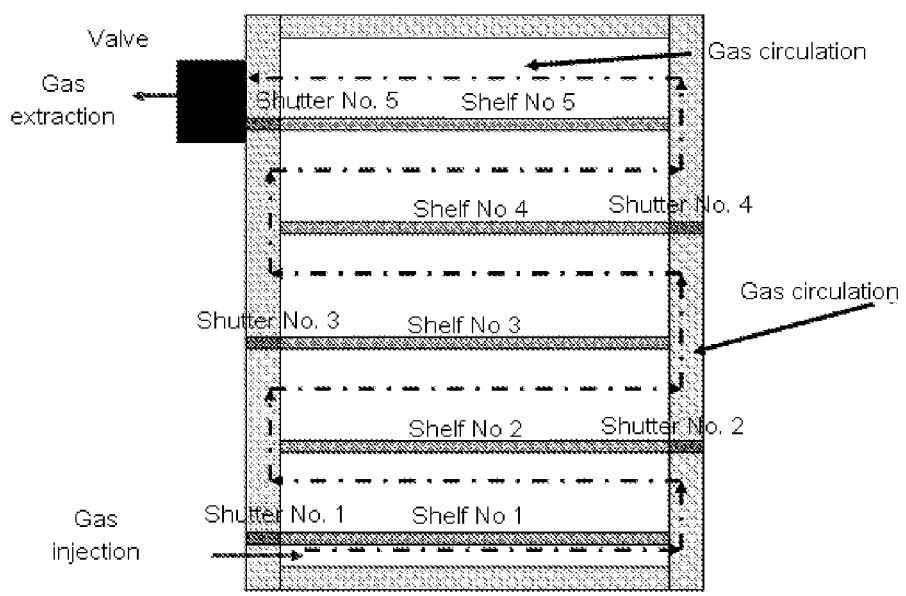
FIG. 3 is a face-on partial schematic view of a device according to the invention using an odd number of shelves (in this instance 5 shelves)

FIG. 3 for its part provides a clear illustration of the advantage afforded by the present invention, through a device (viewed in part) according to the invention, using a 5-shelf module, each of the shelves being equipped (by initial construction or via an attached component) with a shutter.

In this embodiment, the means for discharging the gas are situated on the same vertical wall as the means for conveying the gas, the conveying means being situated in the bottom of the module while the gas is discharged in the top part.

Further, it is perfectly easy to see how, using these shutters, each shutter prevents the gas from passing vertically at the location of the shutter and allows the gas to pass only transversely along the shelf associated with the shutter in question, the gas therefore progresses along the shelves and between two shelves in order to prevent there being any dead zone that is not swept.

Figure 4:
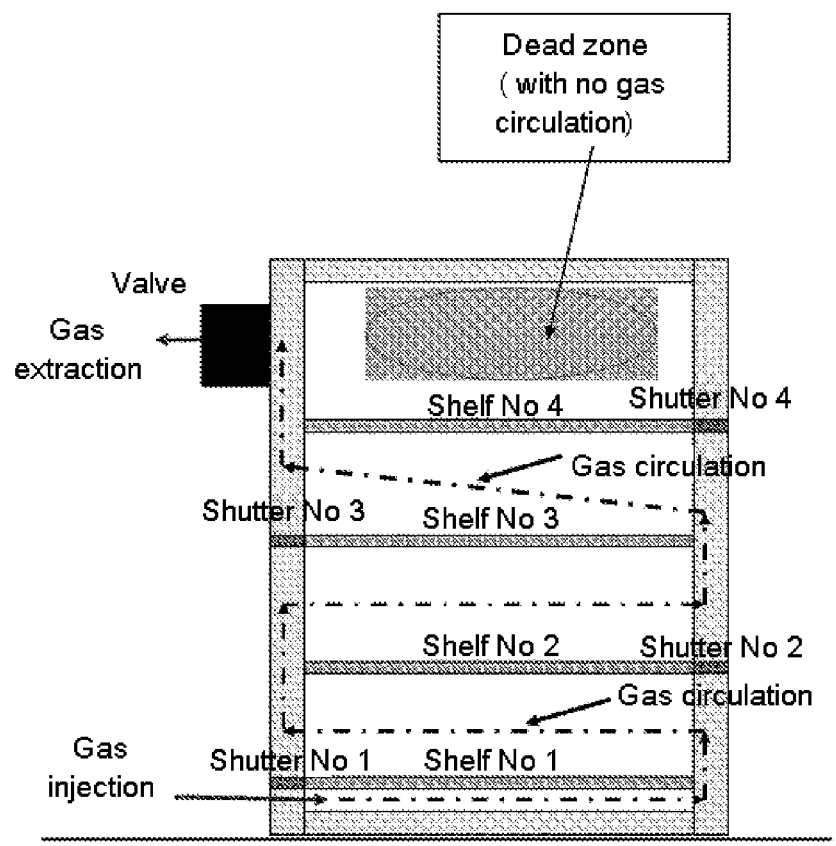
FIG. 4 is a face-on partial schematic view of a device not according to the invention (even number of shelves, creating a dead zone not swept by the gas)

FIG. 4 for its part provides an illustration of a device not in accordance with the invention: it uses an even number (four) of shelves, the last shelf that the gas sees being equipped with a shutter, against the recommendations of the present invention, thus preventing the gas from rising up above this last shelf and thereby creating, on the top, a dead zone not swept by the gas, something which is, of course, detrimental.

Figure 5:
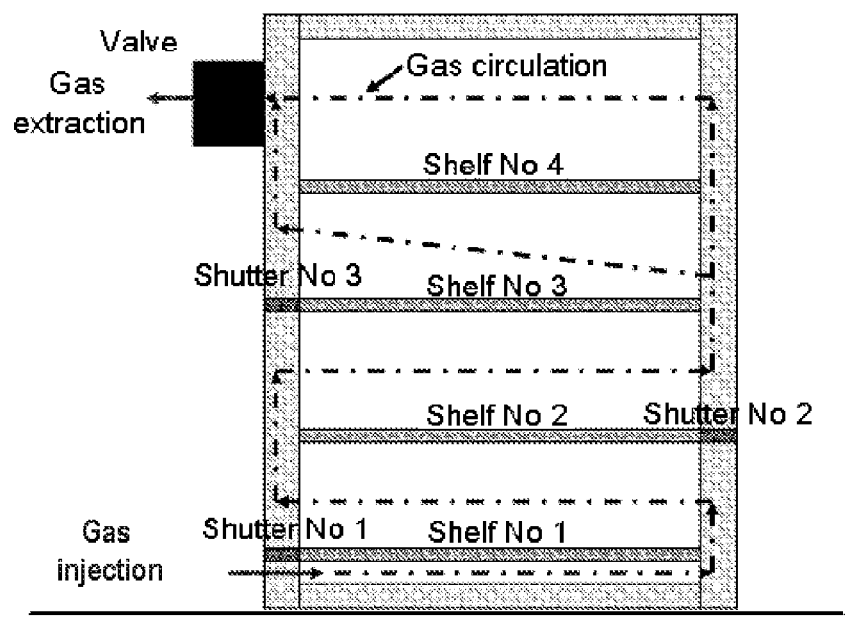
FIG. 5 is a face-on partial schematic view of a device according to the invention, using the same number of shelves as FIG. 4.

In contrast with that, the device of FIG. 5, which is itself a device according to the invention, having the same (even) number of four shelves, but not using a shutter at the last shelf seen by the gas, allows perfect circulation of the gasses from the gas inlet into the device to its outlet, in which all the spaces are swept by the gas one after another.

Figure 6:
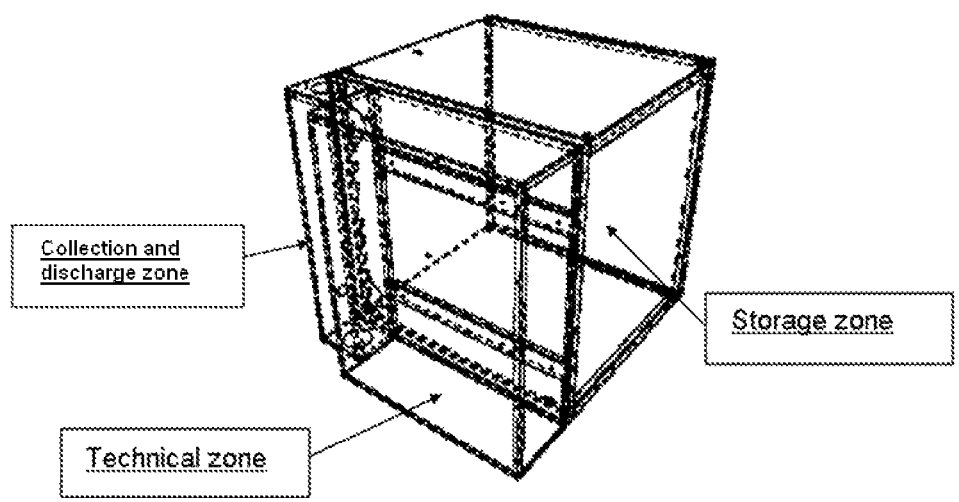
FIG. 6 is a partial schematic view of a device according to the invention, this figure showing one of the ways of embodying the storage, technical and collection zones.

FIG. 6 itself illustrates one of the embodiments of the invention, in which the device comprises, in addition to the storage module proper, a technical module, contiguous with and secured to the storage module at the left-hand vertical wall thereof, in fluidic communication with said storage module and the device comprises a module for collecting and discharging the gases, likewise contiguous with and secured to the storage module at this same left-hand vertical wall in common of the technical module, the means for discharging the gas from the storage module allowing the gases to be discharged from the storage module to the collection module and thence to the outside (via piping connected to this collection module and not depicted here).

One advantageous embodiment of the invention in a fully pneumatic design, implementing the two, technical and collection modules of FIG. 6 is described hereinbelow:
  in order to reduce the risks of excessive overpressure, that could generate a risk to persons and to the hardware, two backpressure regulators (upstream pressure regulator) are used at the collection module:
  a first backpressure regulator maintains a slight raised pressure in the cabinet, typically of the order of 2 mbar;
  if this first, 2 mbar, backpressure regulator should fail, the second backpressure regulator rated, for example, at 10 mbar, takes over;
  and if both these backpressure regulators should fail (although admittedly such a situation is extremely rare) or alternatively should the user extraction network malfunction, there is the further precaution that a seal has been fitted to the door on the front face of the storage module and this seal loses its sealing action at a limit pressure, for example higher than 15 mbar;
  a special, so-called "compression" door handle has been used on the door on the front face of the storage module to eliminate the risk of the user being struck with the door as the door is being opened if there is an abnormal raised pressure inside the storage zone, the operation of which door handle may be summarized as follows:
  in a first phase of the user turning the door handle, a first decompression is carried out, but with the door being kept in the "to" position, i.e. very slightly ajar, with the seal having lost its sealing action but the door still held by the catch that forms part of the construction of the door handle;
  in a second phase of the user turning the door handle, the user opens the catch, this time allowing the door to be opened.

Such door handles are, for example, available from "EMKA".
  the technical module is fluidtight: should one of the elements downstream of the pressure reducer present in the technical module for feeding to the storage module become disconnected, the gas flow rate is limited by a calibrated orifice, likewise present in the technical module downstream of the pressure reducer, and all the remaining gas flow rate is directed to the collection module and thence to the extraction sleeve via one or more nonreturn valves positioned on the wall in common between the technical and collecting modules;
  the device is connected to a source of nitrogen, for example to a nitrogen network of the user site (which stores its products in the module) the maximum permissible pressure of which is, for example, 15 bar. All of the pneumatic components necessary for operation of the device are joined together by tubes which are assembled, for example, using quick-fit couplings.

A manual valve controls the supply to all of the equipment and this valve may be positioned, for example, on the front face or on the back face of the technical module. A filter (filtration cut-off of 20 μm) may be present in order to protect all the components.
  regulating the pressure in the pressure reducer associated with the calibrated orifice situated downstream of the pressure reducer, or with two calibrated orifices according to an advantageous embodiment, means that two nitrogen flow rates can be set, for example a purge flow rate close to 10 $Nm^3/h$ and a sweep flow rate close to 1 $Nm^3/h$.

As has already been pointed out earlier on, the calibrated orifice situated downstream of the pressure reducer limits the flow rate of nitrogen if a tube downstream becomes disconnected.

a door contact switch provides control over whether or not the two nitrogen flow rates are delivered according to whether the door is closed or open (purge flow rate, lower sweep flow rate).

The purge flow rate and the sweep flow rate, both of which can be adjusted through the choice of calibrated orifices, are triggered by the closing of the door, the duration for this purge flow rate being set by an (adjustable) pneumatic timer and when (only) the purge flow rate stops, the sweep flow rate remains.

when the door is opened, both the purge flow rate and sweep flow rate stop.

The advantages offered by the invention are therefore clearly evident to a person skilled in the art:

the structure proposed here is very simple, affording a marked reduction in manufacturing costs, not to mention the fact that according to a preferred embodiment of the invention, the electrical means of controlling the use of the gas are avoided, in favor of pneumatic (fluidic) means, leading to a reduction in the number of components used and also to a markedly lower component purchase cost (by way of example, the cost of an electrically operated valve is very high as those skilled in the art well know. It will also be noted that the "pneumatic" preferred embodiment also eliminates electrical hazards;

the structure proposed here allows for modularity and allows the storage modules to be superposed as has been clearly demonstrated, and allows simplified discharge using one of the structures proposed by the invention comprising collection modules that form a single hollow vertical column to which all of the gases discharged from each storage module of the device are returned;

as one of the embodiments of the invention is purely pneumatic, the device of the invention is very easily transportable because it is quite simply possible to connect a nitrogen cylinder to the device while it is being transported, no other power source being required (it is entirely fluidically powered);

performance in terms of inerting or in terms of maintaining a controlled atmosphere (for example in terms of the dew point) goes without saying: thanks to the structure claimed, each zone is swept, dead volumes are avoided, and the purging of the storage module is automatically far more effective.

It will be understood that many additional changes in the details, materials, steps and arrangement of parts, which have been herein described in order to explain the nature of the invention, may be made by those skilled in the art within the principle and scope of the invention as expressed in the appended claims. Thus, the present invention is not intended to be limited to the specific embodiments in the examples given above.

What is claimed is:

1. A device for storing articles in a controlled atmosphere, comprising:
    at least one storage module able to accommodate the articles that are to be stored; the storage module being equipped with an odd number of shelves on which to position the articles;
    means for conveying gas into said module;
    means for discharging the gas from the module,
    the at least one storage module being of substantially parallelepipedal shape and having two substantially vertical and opposite walls between which the shelves extend, and
    the means for conveying gas allow the gas to be injected into the bottom part of the module or into the top part of the module, through one of the two said walls;
  wherein:
    the means for discharging the gas are situated:
      On the same vertical wall as the means for conveying gas,
      or alternatively on the other vertical wall facing it at the opposite end of the module through the fact that if the gas conveying means are situated at the bottom part of the module then the discharge means are situated at the top part of the module, whereas if the gas conveying means are situated at the top part of the module then the discharge means are situated at the bottom part of the module;
    the storage module comprises shutters, each shutter being positioned, facing one of the shelves, between one of the two walls and the shelf, so as to prevent gas from passing vertically at the location of a shutter and so as to allow the gas to pass only transversally along the shelf associated with the shutter in question in order to prevent the occurrence of dead zones that are not swept by the gas;
  wherein:
    the last shelf in the module seen by the circulation of the gas between the conveying of the gas and the discharge of the gas from the module has no shutter based upon the module having an even number of shelves and the means for discharging the gas being situated on the same wall as the means for conveying the gas,
    after passing transversally along a shelf, the gas passes through the shutter in the wall opposite the wall through which the as was discharged, the gas then passes vertically through the wall and discharges through the shutter associate with the subsequent shutter, alternating in transversal direction until the discharge of the gas from the module.

2. The device for storing articles in a controlled atmosphere of claim 1, wherein the shutter associated with a shelf is a mechanical component separate from the shelf in question itself, but secured to the shelf in question and extending all along the shelf in question.

3. The device for storing articles in a controlled atmosphere of claim 1, wherein the shutter associated with a shelf is part of the shelf in question itself, by construction.

4. The device for storing articles in a controlled atmosphere of claim 1 wherein the implementation of the following measures:
    said device comprises at least one technical module, contiguous with and secured to said storage module at one of the vertical walls thereof, in fluidic communication with this storage module;
    said means for conveying gas allow the gas to arrive in the technical module and thence be injected into the bottom part of the storage module or into the top part of the storage module, through the wall in common of the technical module;
    said means for discharging the gas are situated on the same wall as the means for conveying gas and allow the gas to be discharged from the storage module to the technical module and thence to the outside.

5. The device for storing articles in a controlled atmosphere of claim 1, wherein the implementation of the following measures:
- said device comprises at least one technical module, contiguous with and secured to said storage module at one of the vertical walls thereof, in fluidic communication with this storage module;
- said means for conveying gas allow the gas to arrive in the technical module and thence be injected into the bottom part of the module or into the top part of the module, through the wall in common of the technical module;
- it comprises at least one gas collection and discharge module, likewise contiguous with and secured to said storage module at the same vertical wall in common of the technical module, said means of discharging the gas allowing the gases to be discharged from the storage module to the collection module and thence to the outside.

6. The device for storing articles in a controlled atmosphere of claim 5, wherein the gas collection and discharge module is fitted with at least one non return valve preventing gases discharged from the storage module from passing from the collection module to the technical module.

7. The device for storing articles in a controlled atmosphere of claim 4, wherein it comprises several storage modules that are superposed in order to obtain the desired overall storage volume for the articles, and in that associated with each storage module is a technical module, contiguous with and secured to the storage module in question at one of the vertical walls thereof, in fluidic communication with this storage module, means for conveying gas allowing the gas to arrive in each technical module and thence be injected into the bottom part of the associated module or into the top part of the associated module, through the wall they have in common, means for discharging the gas being situated on the same wall as the means for conveying gas and allowing the gas to be discharged from the storage module to the associated technical module and thence to the outside.

8. The device for storing articles in a controlled atmosphere of claim 5, wherein it comprises several storage modules that are superposed in order to obtain the desired overall storage volume for the articles, and in that associated with each storage module is a technical module, contiguous with and secured to the storage module in question at one of the vertical walls thereof, in fluidic communication with this storage module, means for conveying gas allowing the gas to arrive in each technical module and thence be injected into the bottom part of the associated module or into the top part of the associated module, through the wall they have in common, and in that, associated with each storage module is a gas collection and discharge module, likewise contiguous with and secured to the storage module at the same vertical wall in common of the technical module, said means of discharging the gas allowing the gases to be discharged from the storage module to the collection module associated with it and thence to the outside.

9. The device for storing articles in a controlled atmosphere of claim 8, wherein the collection modules of the device form a single hollow vertical column to which all of the gases discharged from each storage module of the device are returned.

10. The device for storing articles in a controlled atmosphere of claim 1, wherein said means for conveying gas comprise only elements of a pneumatic type, to the exclusion of any electrical element.

* * * * *